(12) United States Patent
Jo et al.

(10) Patent No.: US 11,656,324 B2
(45) Date of Patent: May 23, 2023

(54) METHOD FOR GENERATING SQUEEZED QUANTUM ILLUMINATION LIGHT SOURCE AND QUANTUM RADAR DEVICE USING THE SAME

(71) Applicant: AGENCY FOR DEFENSE DEVELOPMENT, Daejeon (KR)

(72) Inventors: Yong Gi Jo, Daejeon (KR); Taek Jeong, Daejeon (KR); Jung Hyun Kim, Daejeon (KR); Duk Young Kim, Daejeon (KR); Yong Sup Ihn, Daejeon (KR); Zae Ill Kim, Daejeon (KR); Su Yong Lee, Daejeon (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 0 days.

(21) Appl. No.: 17/888,865

(22) Filed: Aug. 16, 2022

(65) Prior Publication Data
US 2023/0054964 A1 Feb. 23, 2023

(30) Foreign Application Priority Data
Aug. 18, 2021 (KR) .................. 10-2021-0108787

(51) Int. Cl.
*G01S 7/03* (2006.01)
*G01S 13/86* (2006.01)
(Continued)

(52) U.S. Cl.
CPC .............. *G01S 7/03* (2013.01); *G01S 13/865* (2013.01); *H01L 31/0352* (2013.01); *H01S 3/0057* (2013.01); *H01S 3/09* (2013.01)

(58) Field of Classification Search
CPC ......... H01L 31/0352; H01L 31/035236; H01L 33/06; H01S 5/00; H01S 3/0057;
(Continued)

(56) References Cited

U.S. PATENT DOCUMENTS 8,111,722 B1 * 2/2012 Maleki ................ G02F 1/353
372/18
9,798,006 B2 * 10/2017 Lanzagorta ............. G01S 17/87
(Continued)

FOREIGN PATENT DOCUMENTS

KR 101199202 B1 11/2012
KR 101641028 B1 7/2016
(Continued)

OTHER PUBLICATIONS

Yonggi Jo et al., "Quantum illumination with asymmetrically squeezed two-mode light", arXiv:2103.17006v1 (Mar. 31, 2021), pp. 1-8.
(Continued)

*Primary Examiner* — Peter M Bythrow
(74) *Attorney, Agent, or Firm* — Miles & Stockbridge P.C.

(57) ABSTRACT

Provided is a method of generating a squeezed quantum illumination light source, including generating a dual mode squeezed light source including a signal mode and an idler mode, obtaining a degree of additional squeezing for the dual mode squeezed light source based on object information, determining a squeezing angle and a degree of operation that satisfy the degree of additional squeezing for each of the signal mode and the idler mode, and squeezing the dual mode squeezed light source based on the squeezing angle and the degree of operation, and provided is a quantum radar device using the squeezed quantum illumination light source.

17 Claims, 8 Drawing Sheets

(51) Int. Cl.
  *H01S 3/09*    (2006.01)
  *H01S 3/00*    (2006.01)
  *H01L 31/0352*  (2006.01)

(58) Field of Classification Search
  CPC ........ H01S 3/227; H01S 3/0941; G02F 1/017; G01S 7/03; G01S 7/032; G01S 13/865
  See application file for complete search history.

(56) References Cited

U.S. PATENT DOCUMENTS

| | | | | |
|---|---|---|---|---|
| 9,983,052 | B1* | 5/2018 | Brown | G01S 17/89 |
| 11,515,851 | B2* | 11/2022 | Vesterinen | H10N 60/0912 |
| 2007/0296953 | A1* | 12/2007 | Allen | G01S 7/41 |
| | | | | 356/28 |
| 2010/0177297 | A1* | 7/2010 | Guha | G01C 3/08 |
| | | | | 356/4.01 |
| 2010/0258708 | A1* | 10/2010 | Meyers | G01S 17/89 |
| | | | | 356/5.1 |
| 2012/0076503 | A1* | 3/2012 | Habit | G01S 7/4912 |
| | | | | 398/140 |
| 2012/0169523 | A1 | 7/2012 | Lee et al. | |
| 2015/0029052 | A1* | 1/2015 | Leskosek | G01S 13/04 |
| | | | | 342/27 |
| 2016/0018525 | A1* | 1/2016 | Lanzagorta | G01S 17/93 |
| | | | | 701/472 |
| 2016/0209497 | A1* | 7/2016 | Habit | G01S 7/495 |
| 2019/0252848 | A1* | 8/2019 | Quinlan | G02F 1/00 |
| 2019/0339587 | A1* | 11/2019 | Vernon | G02F 1/3556 |
| 2021/0184416 | A1* | 6/2021 | Marlow | H01S 3/0941 |
| 2021/0299879 | A1* | 9/2021 | Pinter | B25J 9/1697 |
| 2021/0341618 | A1* | 11/2021 | Gomi | G01S 17/89 |
| 2022/0038625 | A1* | 2/2022 | Gomi | G01S 7/4816 |
| 2022/0171089 | A1* | 6/2022 | Fuentes | G01V 7/02 |
| 2022/0373735 | A1* | 11/2022 | Safavi-Naeini | G02F 1/212 |

FOREIGN PATENT DOCUMENTS

| | | |
|---|---|---|
| KR | 101677991 B1 | 11/2016 |
| KR | 101960425 B1 | 3/2019 |
| KR | 102081373 B1 | 4/2020 |

OTHER PUBLICATIONS

Jong-Jin Seong et al., "Tendencies and Prospects on Quantum Radar Systems", The Journal of Korean Institute of Communications and Information Sciences, 43(12), 2018.12, 2155-2167 (13 pages), last accessed Sep. 7, 2021.

* cited by examiner

METHOD FOR GENERATING SQUEEZED QUANTUM ILLUMINATION LIGHT SOURCE AND QUANTUM RADAR DEVICE USING THE SAME

CROSS-REFERENCE TO RELATED APPLICATION(S)

This application claims the benefit of Korean Patent Application No. 10-2021-0108787, filed on Aug. 18, 2021, in the Korean Intellectual Property Office, the disclosure of which is incorporated herein by reference.

BACKGROUND

1. Field of the Invention

Example embodiments relate to systems, devices, methods, and instructions for generating a squeezed quantum illumination light source, and a quantum radar device using the same. Specifically, the example embodiments relate to a systems, devices, methods, and instructions for generating a squeezed quantum illumination light source that improves the efficiency of quantum illumination using additional local squeezing operation, and a device using the same.

2. Description of the Related Art

Quantum illumination is a technology that detects the existence of an object, using quantum light, and the quantum illumination is known to have higher detection efficiency when the background noise is large and the object's reflectance is low compared to using typical light, such as laser. The state of light mainly used as a light source in quantum illumination is a two-mode squeezed vacuum (TMSV) state, and the TMSV state may be calculated based on the average number of photons in each of the signal mode and the idler mode. The TMSV state is a state in which the two modes have quantum entanglement that cannot be explained by classical physics theory, and the quantum entanglement is known to be a very strong correlation.

In quantum illumination, a signal of the signal mode is sent to the object, and the return signal and the idler mode signal are measured together to determine the existence of the object. At this time, if the object is present, some of the signal in the signal mode and thermal noise will be received together, and if the object does not exist, only thermal noise will be received. When the thermal noise is very large, it is difficult to distinguish the two signals, and it is common to overcome the difficulty by using quantum correlation.

As with general object detection techniques, in quantum illumination, the stronger the detection signal is, the more reflected signals there are, and thus it is possible to detect an object better. However, the quantum squeezing operation required to generate the TMSV state is limited by current technology, and accordingly, there is also a difficulty to improve the efficiency of quantum illumination.

SUMMARY

Accordingly, the embodiments of the present invention are directed to systems, methods, devices, and computer-readable non-transitory instructions for generating squeezed quantum illumination light source and quantum radar device using the same that substantially obviates one or more problems due to limitations and disadvantages of the related art.

An aspect provides systems, devices, methods, and instructions to overcome the limitations of the quantum squeezing operation required to generate the TMSV state of the strongest signal and to improve the efficiency of quantum illumination.

The solutions to technical problems achieved by example embodiments of the present disclosure are not limited to the technical problems described above, and other technical problems may be understood from the following example embodiments.

According to an aspect, there is provided a method of generating a squeezed quantum illumination light source, including generating a dual mode squeezed light source including a signal mode and an idler mode, obtaining a degree of additional squeezing for the dual mode squeezed light source based on object information, determining a squeezing angle and a degree of operation that satisfy the degree of additional squeezing for each of the signal mode and the idler mode, and squeezing the dual mode squeezed light source based on the squeezing angle and the degree of operation.

According to another aspect, there is provided a quantum radar device using a squeezed quantum illumination light source, the device including a transmitter configured to transmit a radar signal, a receiver configured to receive a radar signal, and a controller configured to control the transmitter and the receiver, wherein the controller is configured to generate a dual mode squeezed light source that includes a signal mode and an idler mode, determine a degree of additional squeezing for the dual mode squeezed light source based on object information, determine a squeezing angle and a degree of operation that satisfy the degree of additional squeezing for each of the signal mode and the idler mode, and squeeze the dual mode squeezed light source based on the squeezing angle and the degree of operation.

According to another aspect, there is provided a computer-readable non-transitory medium storing a program and instructions for executing a method of generating a squeezed quantum illumination light source on a computer, wherein the method including generating a dual mode squeezed light source including a signal mode and an idler mode, determining a degree of additional squeezing for the dual mode squeezed light source based on object information, determining a squeezing angle and a degree of operation that satisfy the degree of additional squeezing for each of the signal mode and the idler mode, and squeezing the dual mode squeezed light source based on the squeezing angle and the degree of operation.

According to example embodiments, it is possible to improve the detection efficiency of quantum illumination without changing the quantum correlation, by using an additional local squeezing operation on the TMSV state signal.

Further, according to example embodiments, an appropriate additional squeezing variable may be determined based on information about an object, and an appropriate squeezing angle and the degree of operation may be applied to signals in a signal mode and an idler mode based on the additional squeezing variable. Thus, a local squeezing operation with a large degree of squeezing may be possible.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Terms used in the example embodiments are selected as currently widely used general terms as possible while considering the functions in the present disclosure. However, the terms may vary depending on the intention or precedent of a person skilled in the art, the emergence of new technology, and the like. Further, in certain cases, there are also terms arbitrarily selected by the applicant, and in the cases, the meaning will be described in detail in the corresponding descriptions. Therefore, the terms used in the present disclosure should be defined based on the meaning of the terms and the contents of the present disclosure, rather than the simple names of the terms.

Throughout the specification, when a part is described as "comprising or including" a component, it does not exclude another component but may further include another component unless otherwise stated. Further, expression "at least one of a, b and c" described throughout the specification may include "a alone," "b alone," "c alone," "a and b," "a and c," "b and c" or "all of a, b and c."

Hereinafter, example embodiments of the present disclosure will be described in detail with reference to the accompanying drawings so that those of ordinary skill in the art to which the present disclosure pertains may easily implement them. However, the present disclosure may be implemented in multiple different forms and is not limited to the example embodiments described herein. Hereinafter, example embodiments of the present disclosure will be described in detail with reference to the drawings.

Figure 1:
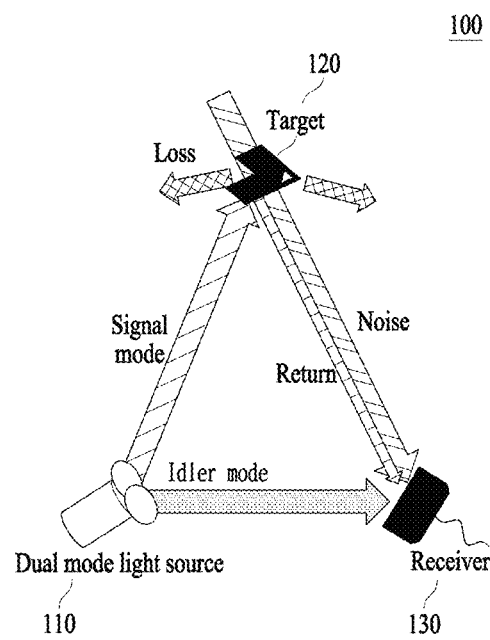
FIG. 1 is a diagram illustrating a configuration of quantum illumination.

FIG. 1 is a diagram illustrating a configuration of quantum illumination.

The basic configuration of quantum illumination 100 is to detect a target 120 based on a dual mode light source 110 including a signal in the signal mode and a signal in the idler mode. Specifically, the quantum illumination 100 may transmit a signal in the signal mode to the target 120, transmit a signal in the idler mode to a receiver 130, and detect the presence or absence of the target 120 based on whether the signal in the signal mode reflected from the target 120 and the noise by the target 120 are sensed by the receiver 130.

For example, the signal in the signal mode may be transmitted toward the target 120 and some may be lost and some may be returned (or reflected) according to the reflectance of the target 120. In addition, a noise signal may be transmitted to the receiver 130 according to the degree of thermal noise of the target 120. The receiver 130 of the quantum illumination 100 may measure the return signal and the signal in the idler mode together to measure the cross-correlation between the signal in the signal mode and the signal in the idler mode, and accordingly determine the presence or absence of the target 120. According to the example embodiment, if the target 120 exists, some of the signal in the signal mode and noise returned are sensed by the receiver 130 together with the signal in the idler mode, and if the target 120 does not exist, only noise is sensed with the signal in the idler mode.

Meanwhile, quantum illumination applied to actual detection technology is used to detect various objects, and thus the reflected signal in the signal mode may be weak or difficult to distinguish from noise, depending on factors as reflectance and thermal noise of an object to be detected. Therefore, in order to increase the detection efficiency of an object, a stronger signal needs to be transmitted. To this end, the present disclosure proposes a method for improving the detection efficiency of quantum illumination by using an additional local squeezing operation.

Figure 2:
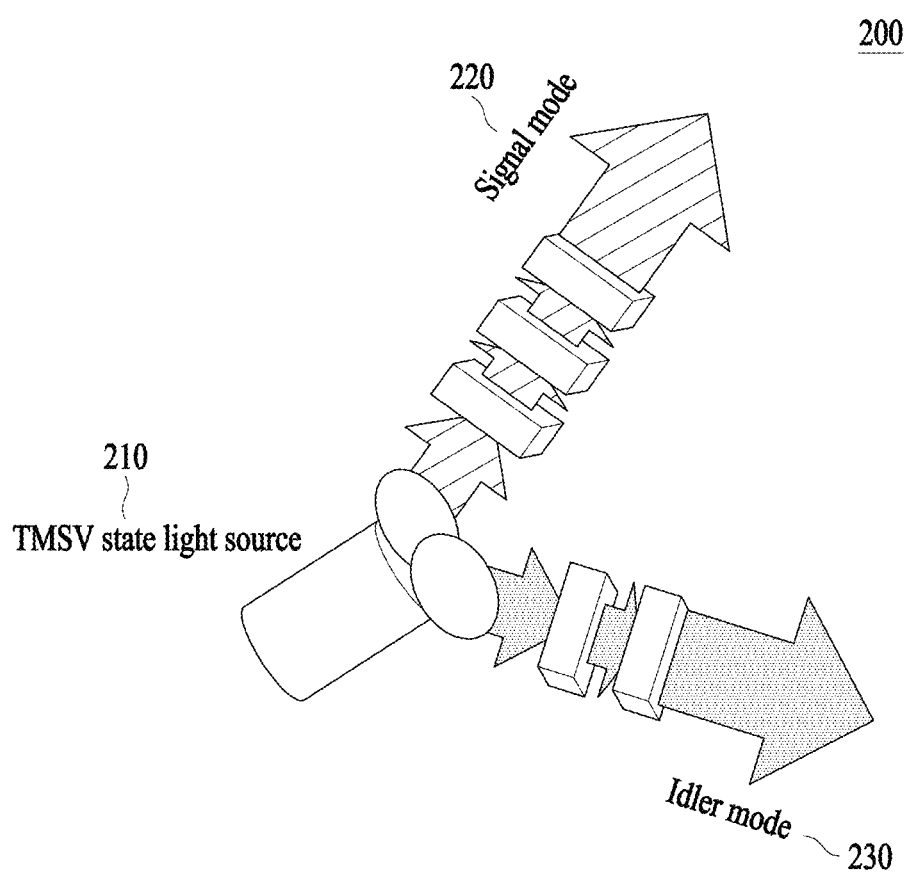
FIG. 2 is a diagram illustrating a quantum illumination light source to which an additional local squeezing operation is applied according to an example embodiment.

FIG. 2 is a diagram illustrating a quantum illumination light source to which an additional local squeezing operation is applied according to an example embodiment.

According to the example embodiment, in order to generate a squeezed quantum illumination light source, first, a TMSV state as a light source 210 including a signal mode and an idler mode may be generated. According to the example embodiment, the TMSV state as the light source 210 may be generated by a method using a spontaneous parametric down-conversion (SPDC) crystal, or a spontaneous four-wave mixing (SFWM) method using an atomic vapor cell or an optical fiber.

The TMSV state may be expressed by the following equation based on the number of photons.

$$|TMSV\rangle = \sum_{n=0}^{\infty} \sqrt{\frac{N_0^n}{(N_0+1)^{(n+1)}}} |n\rangle_S |n\rangle_I \qquad \text{[Equation 1]}$$

Here, S and I represent the signal mode and the idler mode, respectively, and No represents the average number of photons in the TMSV state, and $|n\rangle_S |n\rangle_I$ indicates that n particles are in the signal mode and the idler mode.

Next, the degree of additional squeezing for the TMSV state as the light source 210 may be determined based on information of an object to be detected. According to the example embodiment, the information of the object may include reflectance of the object and thermal noise, and an appropriate degree of additional squeezing may be determined while changing information of the object through experiments. In addition, a signal in a signal mode 220 and a signal in an idler mode 230 may be additionally squeezed based on the determined degree of additional squeezing. Referring to FIG. 2, the additionally and locally squeezed signal in the signal mode 220 may be positioned toward the object, and the additionally and locally squeezed signal in the idler mode 230 may be positioned toward the receiver. In this case, the local squeezing operation may be applied through an OPO in the optical frequency range, and the local squeezing operation may be applied through a Josephson junction in a cryogenic superconducting circuit in the microwave frequency range. According to the example embodiment, the local squeezing operation may be performed in at least one of an optical frequency range and a microwave frequency range.

Figure 3:
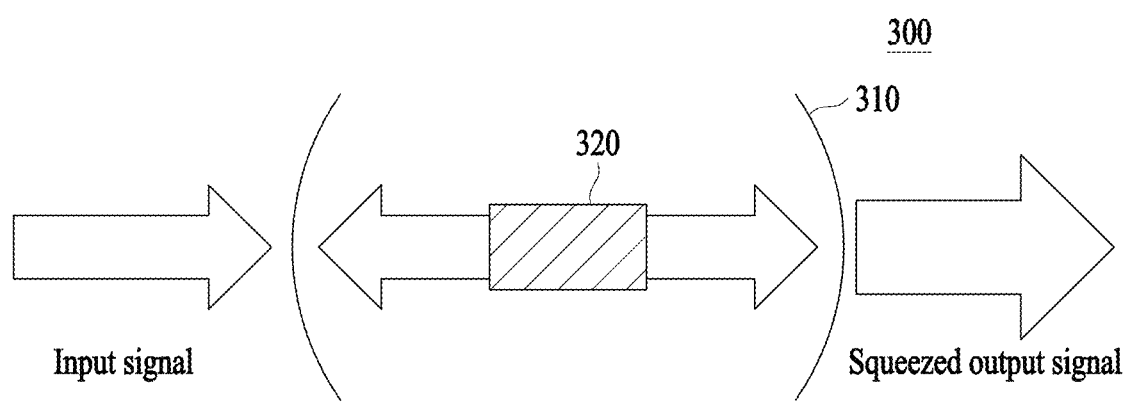
FIG. 3 is a diagram illustrating an optical parametric oscillator (OPO) for generating a local squeezed quantum illumination light source according to an example embodiment.

FIG. 3 is a diagram illustrating an OPO for generating a local squeezed quantum illumination light source according to an example embodiment.

According to the example embodiment, an OPO 300 may pass an input signal through an optical cavity 310 to squeeze the signal, and may perform an operation of outputting the squeezed signal. Specifically, the OPO 300 may place a non-linear crystal 320 performing down-conversion in the optical cavity 310 and then input a signal. In this case, the input signal may be a TMSV state signal. The signal input to the optical cavity 310 is locally squeezed by the non-linear crystal 320, and the degree of squeezing operation may be determined according to the characteristics of the non-linear crystal 320. For example, the degree of squeezing operation may be determined by the degree of non-linearity of the non-linear crystal 320 and a quality factor of the optical cavity. The degree of squeezing operation may be adjusted by changing the temperature, electric field and magnetic field of the non-linear crystal 320, and thus the state of the non-linear crystal 320 may be changed to satisfy the determined degree of squeezing operation. In addition, the input signal passing through the optical cavity 310 may be locally squeezed and output at an output terminal.

Meanwhile, as the degree of squeezing operation increases in the TMSV state, there is a limit to the squeezing technique, and thus in order to satisfy the desired degree of squeezing operation, it is necessary to consider a method for overcoming the limitation. According to the example embodiment, when a squeezing operation is sequentially executed multiple times, squeezing stronger than a single squeezing operation is possible. In this case, each squeezing may be operated with the same squeezing angle.

The method for local squeezing operation may be mathematically represented as follows.

$$\hat{S}(z) = \exp\left[\frac{1}{2}(z^*\hat{a}^2 - z\hat{a}^{\dagger 2})\right]$$ [Equation 2]

Here, squeezing variable z is a complex number, and $\hat{a}$ and $\hat{a}^\dagger$ indicate annihilation and creation operators of photons. Squeezing variable $z=re^{i\phi}$, and r and $\phi$ represent the degree of squeezing operation and a squeezing angle, respectively. For an example, if the squeezing angle is 0, then z is a real number, and when squeezing operations of which degree of squeezing operation is r1, r2 and r3 are sequentially performed in a vacuum state, it may be expressed as follows.

$$\hat{S}(r_3)\hat{S}(r_2)\hat{S}(r_1)|vac\rangle = \hat{S}(r_{total})|vac\rangle.$$ [Equation 3]

Here, $|vac\rangle$ indicates a vacuum state, and $r_{total}=r_1+r_2+r_3$. Therefore, when performing the local squeezing operations sequentially, it is easy to implement the local squeezing operations with a large degree of squeezing.

According to the example embodiment, when generating a squeezed quantum illumination light source using the OPO 300, a degree of additional squeezing for the TMSV state as the light source may be obtained, and while the temperature, electric field and magnetic field of the non-linear crystal 320 being changed to satisfy the obtained degree of additional squeezing, an input signal may be locally squeezed by the desired degree of squeezing.

According to the example embodiment, the degree of additional squeezing may be determined by further considering information about a receiver that receives a locally squeezed signal. For example, with respect to the receiver, there may be an optimized receiver with optimal SNR efficiency for the returned signal and noise, and a general receiver that is not optimized. According to the type of the receiver, a squeezing angle and a degree of squeezing operation that may be applied to the TMSV state as the light source to achieve a degree of additional squeezing may be determined differently.

Figure 4:
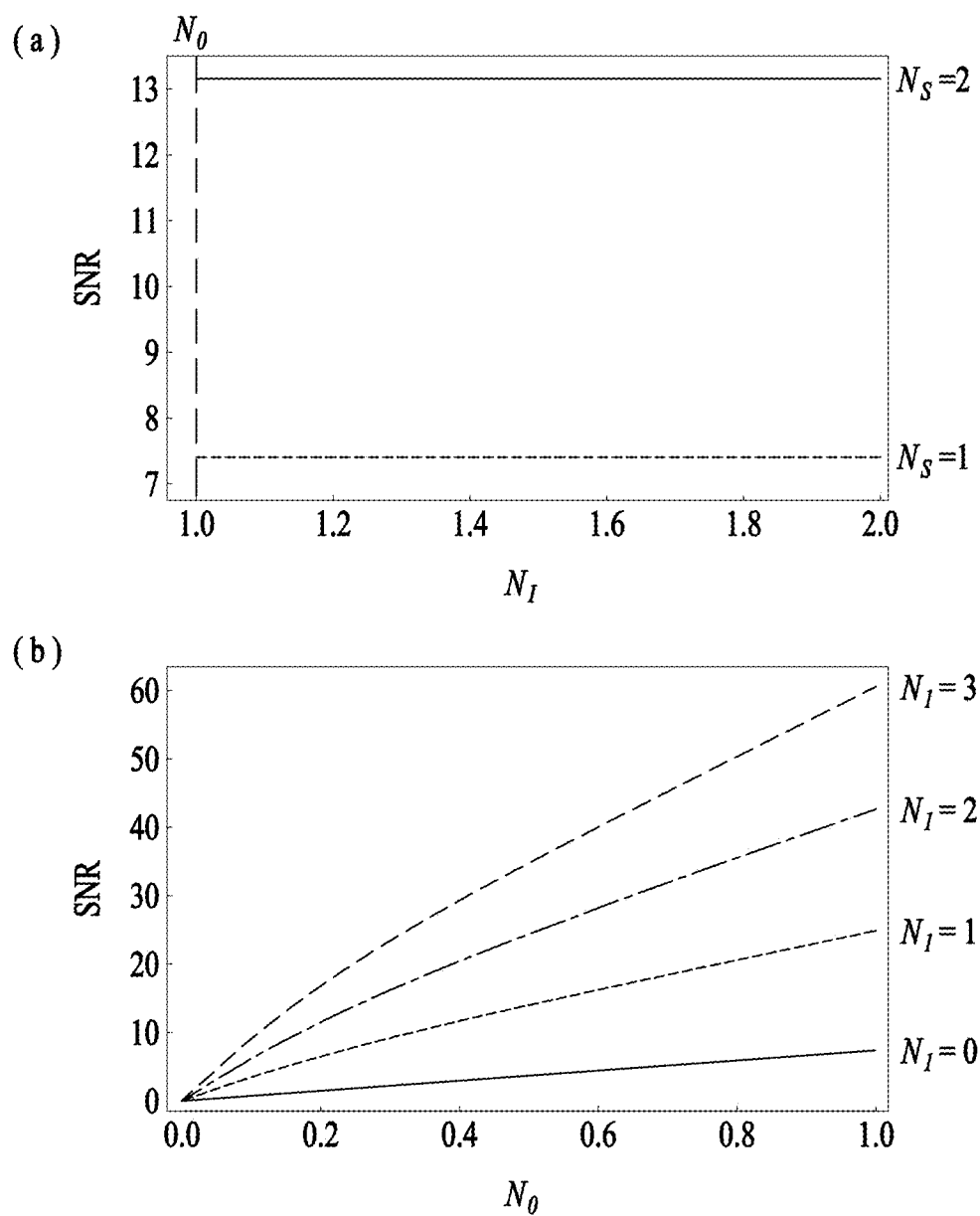
FIG. 4 illustrates signal-to-noise ratio (SNR) analysis graphs of quantum illumination using an additional local squeezing method according to an example embodiment based on an optimized receiver.

FIG. 4 illustrates SNR analysis graphs of quantum illumination using an additional local squeezing method according to an example embodiment based on an optimized receiver.

Graph (a) of FIG. 4 illustrates the relationship between local squeezing and the SNR for a signal in the idler mode, and graph (b) of FIG. 4 illustrates the relationship between the local squeezing and the SNR for a signal in the signal mode.

For FIG. 4, used is a quantum Chernoff bound (QCB) method that may obtain the theoretical maximum efficiency of quantum illumination. In case of using the QCB method, it is possible to obtain the physically possible maximum efficiency considering a given quantum state, the reflectance of an object and the degree of thermal noise. In FIG. 4, the degree of squeezing operation for a signal is represented by the average number of photons in a vacuum state, and this is for the convenience of analysis.

Accordingly, the average number of photons for a signal in a vacuum state may be calculated by the following equation.

$$N_j = \sinh^2 r_j$$ [Equation 4]

Here, r is the degree of squeezing operation. When j is 1, it indicates squeezing of the signal mode, and when j is 2, it indicates local squeezing of the idler mode. $N_S$ and $N_I$ are the average number of photons in the signal mode and the average number of photons in the idler mode of the finally generated quantum state after local squeezing, respectively.

Referring to (a) of FIG. 4, the x-axis indicates the average number of photons in the idler mode after the local squeezing and the y-axis indicates the SNR of quantum illumination, and it can be seen that the change in the average number of photons in the idler mode does not affect the SNR. Therefore, if an optimized receiver is operated, regardless of the degree of squeezing operation of the signal mode, the local squeezing operation for the idler mode may not affect the efficiency of quantum illumination.

Referring to (b) of FIG. 4, the x-axis indicates the average number of photons in the TMSV state and the y-axis indicates the SNR, and it may be seen that when the average number of photons in the signal mode increases, the SNR also increases. For example, when the degree of squeezing operation of the signal mode increases from 0 to 3, the SNR also increases. Therefore, when an optimized receiver is operated, it may be seen that increasing the degree of local squeezing operation for the signal mode improves the efficiency of quantum illumination.

Figure 5:
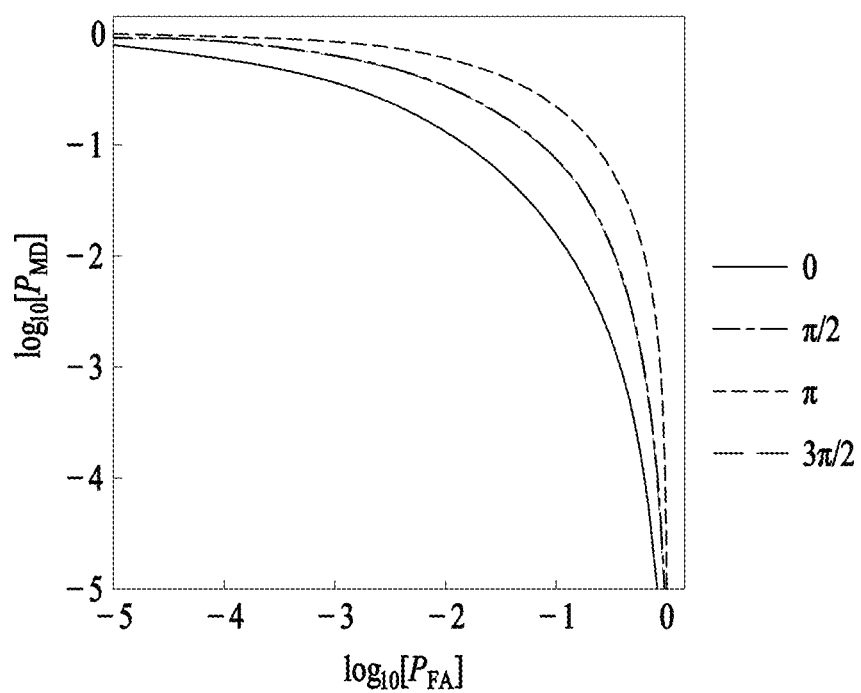
FIG. 5 is a diagram illustrating a graph analyzing the relationship between the squeezing angles of the signal mode and the idler mode of quantum illumination using an additional local squeezed method according to an example embodiment based on a general receiver, and object detection error.

FIG. 5 is a diagram illustrating a graph analyzing the relationship between the squeezing angles of the signal mode and the idler mode of quantum illumination using an additional local squeezed method according to an example embodiment based on a general receiver, and object detection error.

For FIG. 5, used is a method of analyzing receiver operating characteristics (ROC) curves, and the ROC method uses the error rate of detecting an object. Specifically, in the ROC method, detection efficiency may be analyzed using false alarm (FA) which is an error that detects that an object is present even though the object is not present, and missed detection (MD) which is an error that detects that an object is not present even though the object is present. Specifically, it may be seen that the closer the ROC curve is to the lower left, the higher the detection efficiency is.

In FIG. 5, the receiver may be a phase conjugate (PC) receiver showing the highest efficiency among quantum illumination receivers that may be implemented. According to the example embodiment, ROC curves of FIG. 5 are obtained by changing the relationship between the squeezing angles of the signal mode and the idler mode in object detection using the PC receiver. Each of the ROC curves is based on the difference between the squeezing angles of the signal mode and the idler mode. Referring to FIG. 5, when the squeezing angle of the signal mode and the squeezing angle of the idler mode are the same (that is, the difference is 0), the ROC curve is closest to the lower left. Therefore, when the PC receiver is used, when the squeezing angle of the local squeezing operation performed in the signal mode and the squeezing angle of the local squeezing operation performed in the idler mode are the same, the object detection error rate is the lowest.

Figure 6:
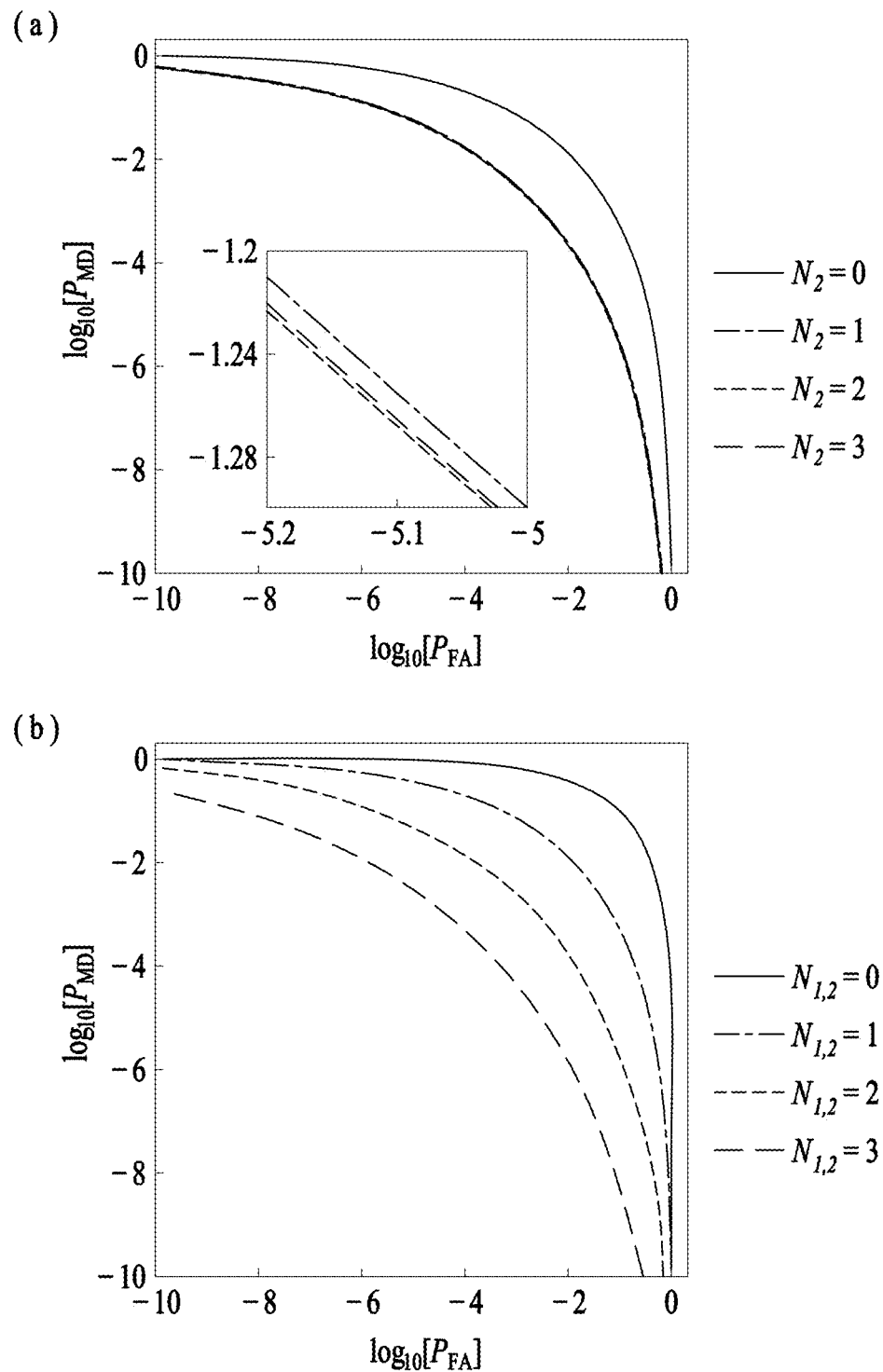
FIG. 6 illustrates graphs analyzing the relationship between the degrees of squeezing operation of a signal mode and an idler mode of quantum illumination using an additional local squeezing method according to an example embodiment based on a general receiver, and an object detection error.

FIG. 6 illustrates graphs analyzing the relationship between the degrees of squeezing operation of a signal mode and an idler mode of quantum illumination using an additional local squeezing method according to an example embodiment based on a general receiver, and an object detection error.

Referring to FIG. 6, (a) illustrates ROC curves according to the local squeezing operations of the idler mode. At this time, the degree of local squeezing operation for the signal mode is $N_1=2$. Referring to (a), when $N_2=2$, it may be seen that the ROC curve is located at the lowest point. Therefore, when the degree of local squeezing operation for the idler mode is the same as the degree of local squeezing operation for the signal mode, in other word, when $N_1=N_2=2$, the error rate is the lowest. Unlike the quantum illumination receiver with optimal efficiency assumed in the QCB analysis, in a practically feasible level of a general quantum illumination receiver, additional local squeezing of the two modes to the same degree of operation may further improve the efficiency of quantum illumination.

Referring to FIG. 6, (b) illustrates the ROC curves according to the squeezing degrees when the idler mode and the signal mode are additionally and locally squeezed with the same degree of operation. Referring to (b), as the degree of squeezing operation increases, the ROC curve approaches closer to the lower left. Therefore, it may be seen that the higher the degree of squeezing operation is, the lower the error rate is, that is, the higher the detection efficiency is.

Figure 7:
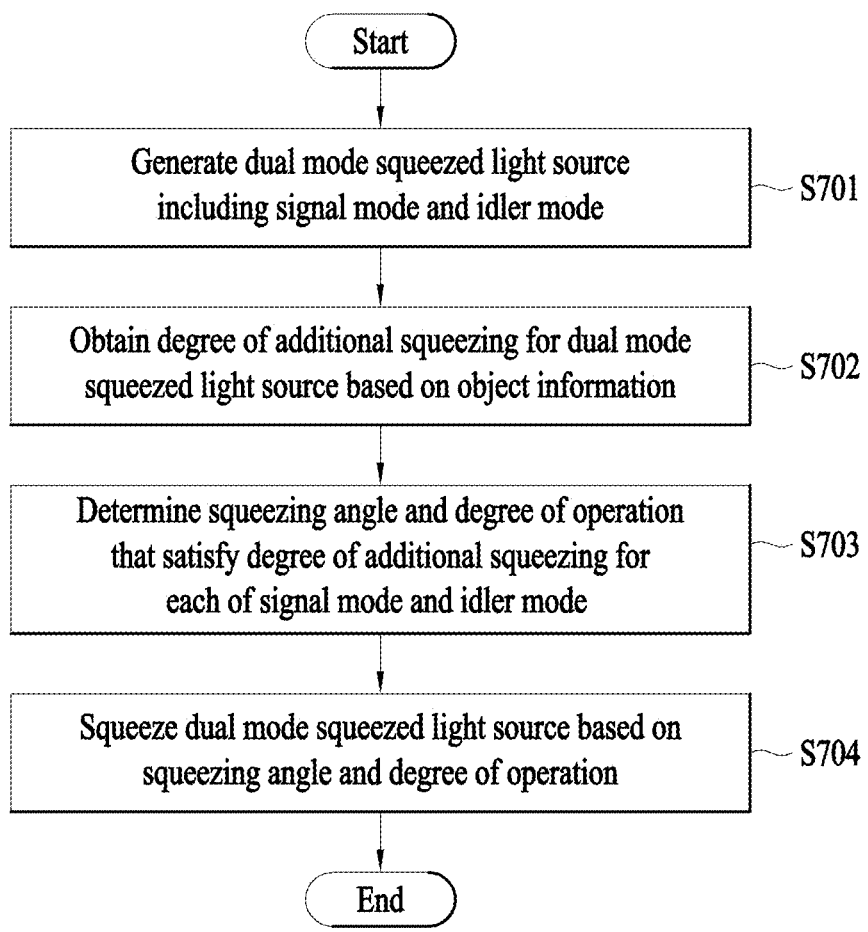
FIG. 7 is a flowchart illustrating a method of generating a squeezed quantum illumination light source according to an example embodiment.

FIG. 7 is a flowchart illustrating a method of generating a squeezed quantum illumination light source according to an example embodiment.

The method may generate a dual mode squeezed (for example, a TMSV state) light source including a signal mode and an idler mode in operation S701. Here, the signal mode is a mode for a signal irradiated to an object, and the idler mode is a mode for a signal transmitted to a receiver without being irradiated to the object. According to the example embodiment, the TMSV state may be generated through a method using an SPDC crystal or a SFWM method.

The method may obtain a degree of additional squeezing for the dual mode squeezed light source based on information of the object in operation S702. According to the example embodiment, the information of the object may include at least one of the reflecting rate and a thermal noise ratio of the object. According to the example embodiment, the degree of additional squeezing may be determined by further considering information about the receiver that receives the squeezed dual mode squeezed light source. At this time, the receiver may be either an optimized receiver with optimal SNR efficiency or a general receiver that may be implemented.

According to the example embodiment, the degree of additional squeezing may be achieved by multiple times' squeezing with the same squeezing angle. For example, with the same squeezing angle, the degree of additional squeezing may be achieved with squeezing of a plurality of times with degrees of operation of which at least one pair are the same or different.

It is possible to determine the squeezing angle and the degree of operation that satisfy the degree of additional squeezing for each of the signal mode and the idler mode in operation S703.

According to the example embodiment, in the method, if the receiver is an optimized receiver, only the squeezing angle and a degree of operation for the signal mode may be determined without considering the squeezing of the idler mode. At this time, in the method, the degree of operation for the signal mode may be determined to satisfy the degree of additional squeezing regardless of the degree of operation for the idler mode.

According to the example embodiment, if the receiver is a general receiver, in the method, it may be determined that the squeezing angle and a degree of operation of the signal mode are the same as the squeezing angle and a degree of operation of the idler mode.

In the method, the dual mode squeezed light source may be squeezed based on the squeezing angle and a degree of operation in operation S704. In this case, the dual mode squeezed light source may be squeezed in at least one of an optical frequency band and a microwave frequency band.

Figure 8:
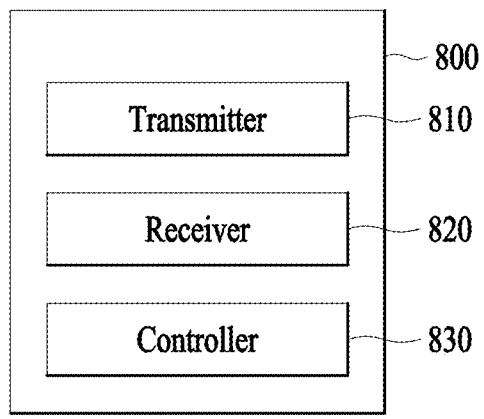
FIG. 8 is a block diagram schematically showing a quantum radar device using a squeezed quantum illumination light source according to an example embodiment.

FIG. 8 is a block diagram schematically showing a quantum radar device using a squeezed quantum illumination light source according to an example embodiment.

According to the example embodiment, a device 800 may include a transmitter 810, a receiver 820, and a controller 830. It can be understood by those of ordinary skill in the art related to the present embodiment that the device 800 may have more or fewer elements than those listed above.

The transmitter 810 may transmit a radar signal. According to the example embodiment, the transmitter 810 may transmit a signal in the signal mode and a signal in the idler mode. The transmitter 810 may transmit a radar signal to a position where an object is estimated to be, regardless of the actual existence of the object. Further, the transmitter 810 may transmit a radar signal towards the receiver 820. At this time, the radar signal may be a signal in a dual-mode squeezing state (for example, a TMSV state), and may be a signal in a state of being additionally and locally squeezed in the TMSV state.

The receiver 820 may receive a radar signal. According to the example embodiment, the receiver 820 may receive at least one of a radar signal transmitted from the transmitter 810 and reflected by the object, the noise transmitted from the object and the radar signal transmitted from the transmitter 810. The receiver 820 may be one of an optimized receiver that produces optimal detection efficiency and a general receiver that may actually be implemented.

The controller 830 may control the transmitter 810 and the receiver 820. The controller 830 may generate a dual mode squeezed light source including a signal mode and an idler mode, and the controller 830 may determine the degree of additional squeezing for the dual mode squeezed light source based on information on the object. Further, the controller 830 may determine a squeezing angle and a degree of operation that satisfy the degree of additional squeezing for each of the signal mode and the idler mode, and the controller 830 may squeeze the dual mode squeezed light source based on the squeezing angle and the degree of operation. Additionally, the controller 830 may transmit a radar signal based on the dual mode squeezed light source through the transmitter 810, and may identify the radar signal incoming through the receiver 820. At this time, the controller 830 may determine that if the radar signal coming through the receiver 820 includes some of the signal in the signal mode and thermal noise, an object is present where the signal in the signal mode is sent, and if the radar signal coming through the receiver 820 does not include some of the signal in the signal mode, an object is not present where the signal in the signal mode is sent.

The above description is merely illustrative of the technical idea of the present disclosure, and various modifications and variations will be possible without departing from the essential quality of the present disclosure by those of ordinary skill in the art to which the present disclosure belongs. Therefore, the example embodiments in the present disclosure are intended to explain, not to limit the technical spirit of the present disclosure, and the scope of the technical spirit of the present disclosure is not limited to the example embodiments. The scope to be protected of the present disclosure should be construed by the following claims, and all technical ideas within the scope of the claims and equivalents should be construed as being included in the scope of the present disclosure.

What is claimed is:

1. A method of generating a squeezed quantum illumination light source, the method comprising:
    generating a dual mode squeezed light source comprising a signal mode and an idler mode;
    obtaining a degree of additional squeezing for the dual mode squeezed light source based on object information and information about the receiver configured to receive the dual mode squeezed light source;
    determining a squeezing angle and a degree of operation that satisfy the degree of additional squeezing for each of the signal mode and the idler mode; and
    squeezing the dual mode squeezed light source based on the squeezing angle and the degree of operation.

2. The method of claim 1,
    wherein the signal model is a mode for a signal irradiated to the object, and
    wherein the idler mode is a mode for a signal transmitted to a receiver.

3. The method of claim 1, wherein the object information comprises at least one of a reflecting rate and a thermal noise ratio of the object.

4. The method of claim 1,
    wherein the receiver is either an optimized receiver or a general receiver.

5. The method of claim 4, wherein the determining the squeezing angle and the degree of operation, if the receiver is the optimized receiver, comprises determining a squeezing angle and a degree of operation only for the signal mode.

6. The method of claim 4, wherein the determining the squeezing angle and the degree of operation, if the receiver is the general receiver, comprises determining that a squeezing angle and a degree of operation of the signal mode are the same as a squeezing angle and a degree of operation of the idler mode.

7. The method of claim 1, wherein the degree of additional squeezing is achieved with multiple-times squeezing with a same squeezing angle.

8. The method of claim 1, wherein the squeezing the dual mode squeezed light source is performed in at least one of an optical frequency band and a microwave frequency band.

9. A quantum radar device using a squeezed quantum illumination light source, the device comprising:
    a transmitter configured to transmit a radar signal;
    a receiver configured to receive a radar signal; and
    a controller configured to control the transmitter and the receiver,
    wherein the controller is configured to:
    generate a dual mode squeezed light source that includes a signal mode and an idler mode;
    determine a degree of additional squeezing for the dual mode squeezed light source based on object information and information about the receiver configured to receive the dual mode squeezed light source;
    determine a squeezing angle and a degree of operation that satisfy the degree of additional squeezing for each of the signal mode and the idler mode; and
    squeeze the dual mode squeezed light source based on the squeezing angle and the degree of operation.

10. A computer-readable non-transitory medium having a program for generating a squeezed quantum illumination light source, the program comprising instructions for:
    generating a dual mode squeezed light source including a signal mode and an idler mode;
    determining a degree of additional squeezing for the dual mode squeezed light source based on object information and information about the receiver configured to receive the dual mode squeezed light source;
    determining a squeezing angle and a degree of operation that satisfy the degree of additional squeezing for each of the signal mode and the idler mode; and
    squeezing the dual mode squeezed light source based on the squeezing angle and the degree of operation.

11. The computer-readable non-transitory medium of claim 10, wherein the signal model is a mode for a signal irradiated to the object, and wherein the idler mode is a mode for a signal transmitted to a receiver.

12. The computer-readable non-transitory medium of claim 10, wherein the object information comprises at least one of a reflecting rate and a thermal noise ratio of the object.

13. The computer-readable non-transitory medium of claim 10, wherein the receiver is either an optimized receiver or a general receiver.

14. The computer-readable non-transitory medium of claim 13, wherein the determining the squeezing angle and the degree of operation, if the receiver is the optimized receiver, comprises determining a squeezing angle and a degree of operation only for the signal mode.

15. The computer-readable non-transitory medium of claim 13, wherein the determining the squeezing angle and the degree of operation, if the receiver is the general receiver, comprises determining that a squeezing angle and a degree of operation of the signal mode are the same as a squeezing angle and a degree of operation of the idler mode.

16. The computer-readable non-transitory medium of claim 10, wherein the degree of additional squeezing is achieved with multiple-times squeezing with a same squeezing angle.

17. The computer-readable non-transitory medium of claim 10, wherein the squeezing the dual mode squeezed light source is performed in at least one of an optical frequency band and a microwave frequency band.

* * * * *